(12) United States Patent
Ikeda et al.

(10) Patent No.: US 9,972,986 B2
(45) Date of Patent: May 15, 2018

(54) ELECTRICAL CONNECTION BOX AND WIRE HARNESS

(71) Applicant: Yazaki Corporation, Tokyo (JP)

(72) Inventors: Tatsuhiko Ikeda, Shizuoka (JP); Takaaki Kakimi, Shizuoka (JP); Akinori Nakashima, Shizuoka (JP); Hirotaka Kiyota, Shizuoka (JP)

(73) Assignee: YAZAKI CORPORATION, Minato-ku, Tokyo (JP)

( * ) Notice: Subject to any disclaimer, the term of this patent is extended or adjusted under 35 U.S.C. 154(b) by 0 days. days.

(21) Appl. No.: 15/712,210

(22) Filed: Sep. 22, 2017

(65) Prior Publication Data

US 2018/0013276 A1 Jan. 11, 2018

Related U.S. Application Data

(63) Continuation of application No. PCT/JP2016/062986, filed on Apr. 26, 2016.

(30) Foreign Application Priority Data

Apr. 27, 2015 (JP) .................................. 2015-090571

(51) Int. Cl.
*H05K 5/00* (2006.01)
*H02G 3/08* (2006.01)
(Continued)

(52) U.S. Cl.
CPC ........... *H02G 3/088* (2013.01); *H01R 9/2416* (2013.01); *H01R 13/5227* (2013.01);
(Continued)

(58) Field of Classification Search
CPC ............................. H01R 13/5227; H05K 5/069
See application file for complete search history.

(56) References Cited

U.S. PATENT DOCUMENTS 8,872,025 B2 * 10/2014 Tamai .................. B62D 5/0406
174/50.5
9,237,667 B2 * 1/2016 Tamai .................. H05K 5/0247
(Continued)

FOREIGN PATENT DOCUMENTS

JP      7-039047 A      2/1995
JP      2002-152943 A   5/2002
(Continued)

OTHER PUBLICATIONS

International Search Report for PCT/JP2016/062986 dated May 31, 2016 [PCT/ISA/210].
(Continued)

*Primary Examiner* — Hung V Ngo
(74) *Attorney, Agent, or Firm* — Sughrue Mion, PLLC

(57) ABSTRACT

An electrical connection box applied to a wire harness includes a casing that includes an accommodating space that is formed therein and that accommodates an electronic component, and a guiding space that is partitioned horizontally lateral to the accommodating space therein via a partition wall, and that extends in a vertical direction and guides water entered therein to a vertically downside. The casing includes a water-preventing rib that is provided in the guiding space, and that guides water guided to the vertically downside in the guiding space, in a direction of avoiding from an avoidance target portion that is positioned vertically below the guiding space.

5 Claims, 12 Drawing Sheets

(51) Int. Cl.
*H01R 9/24* (2006.01)
*H01R 13/52* (2006.01)
*H05K 5/06* (2006.01)
*H01B 7/00* (2006.01)

(52) U.S. Cl.
CPC ........... *H05K 5/069* (2013.01); *H01B 7/0045* (2013.01); *H01R 2201/26* (2013.01)

(56) References Cited

U.S. PATENT DOCUMENTS

| | | | | |
|---|---|---|---|---|
| 9,337,633 | B2* | 5/2016 | Suzuki | H02G 3/088 |
| 2003/0000720 | A1 | 1/2003 | Sato | |
| 2004/0214458 | A1* | 10/2004 | Maebashi | H01H 9/10 |
| | | | | 439/76.2 |
| 2005/0178576 | A1 | 8/2005 | Saka et al. | |
| 2006/0089021 | A1* | 4/2006 | Kanamaru | B60R 16/0215 |
| | | | | 439/76.2 |
| 2008/0299800 | A1* | 12/2008 | Yoshida | H01R 13/5227 |
| | | | | 439/76.2 |
| 2009/0221160 | A1* | 9/2009 | Taniguchi | H02G 3/083 |
| | | | | 439/76.2 |
| 2010/0136805 | A1* | 6/2010 | Maebashi | B60R 16/0238 |
| | | | | 439/76.2 |
| 2014/0154896 | A1* | 6/2014 | Makino | H02G 3/088 |
| | | | | 439/76.2 |
| 2016/0205798 | A1* | 7/2016 | Eamon | G01N 33/48785 |
| | | | | 361/752 |
| 2017/0254700 | A1* | 9/2017 | Mizusaki | G01J 1/44 |

FOREIGN PATENT DOCUMENTS

| | | |
|---|---|---|
| JP | 2002-369335 A | 12/2002 |
| JP | 2005-229740 A | 8/2005 |
| JP | 2015-233353 A | 12/2015 |

OTHER PUBLICATIONS

Written Opinion for PCT/JP2016/062986 dated May 31, 2016 [PCT/ISA/237].

* cited by examiner

_US 9,972,986 B2_

ELECTRICAL CONNECTION BOX AND WIRE HARNESS

CROSS-REFERENCE TO RELATED APPLICATION

This application is a continuation application of International Application PCT/JP2016/062986, filed on Apr. 26, 2016, and designating the U.S., the entire contents of which are incorporated herein by reference.

BACKGROUND OF THE INVENTION

1. Field of the Invention

The present invention relates to an electrical connection box and a wire harness.

2. Description of the Related Art

As a conventional electrical connection box applied to a wire harness installed in a vehicle and the like, for example, Japanese Patent Application Laid-open No. 2002-369335 discloses an electrical connection box in which side walls of a container main body are double walls including an outer wall and an inner wall. The electrical connection box includes a horizontal rib that separates the outer wall from the inner wall. A plurality of upper ribs that extend in the height direction are provided above the horizontal rib at predetermined intervals. Also, a plurality of lower ribs that extend in the height direction are provided below the horizontal rib at predetermined intervals. Because a communicating hole that communicates the upper space with the lower space is provided between each of the upper ribs of the horizontal rib, the electrical connection box can prevent the outer wall from deforming as well as water from entering the container main body.

There is still room for improving the electrical connection box disclosed in Japanese Patent Application Laid-open No. 2002-369335 described above, for example, in treating water entered in the double walls.

SUMMARY OF THE INVENTION

The present invention has been made in view of the above circumstances, and an object of the present invention is to provide an electrical connection box and a wire harness that can suitably treat water entered in a casing.

In order to achieve the above mentioned object, an electrical connection box according to one aspect of the present invention includes a casing that includes an accommodating space that is formed therein and that accommodates an electronic component, and a guiding space that is partitioned horizontally lateral to the accommodating space therein via a partition wall, that extends in a vertical direction and guides water entered in the casing to a vertically downside, wherein the casing includes a water-preventing rib that is provided in the guiding space, and that guides water guided to the vertically downside in the guiding space, in a direction of avoiding from an avoidance target portion that is positioned vertically below the guiding space.

According to another aspect of the present invention, in the electrical connection box, it is possible to configure that the casing includes an insertion opening through which an electric wire connected to the electronic component is inserted, the avoidance target portion includes the electric wire that is inserted through the insertion opening and that crosses vertically below the guiding space, and the water-preventing rib includes an inclined surface that is positioned vertically above the avoidance target portion and that extends to a position deviated from vertically above the avoidance target portion.

According to still another aspect of the present invention, in the electrical connection box, it is possible to configure that the casing has a bottom portion positioned vertically below the guiding space, the avoidance target portion includes a bottom proximity part close to the electronic component side with respect to a destination of avoidance of the water by the water-preventing rib in the bottom portion, the water-preventing rib includes an inclined surface that is positioned vertically above the bottom proximity part and extends to the destination of avoidance.

In order to achieve above mentioned object, a wire harness according to still another aspect of the present invention includes an electric wire; and an electrical connection box that includes a casing that includes an accommodating space formed therein and that accommodates an electronic component connected to the electric wire, and a guiding space that is partitioned horizontally lateral to the accommodating space therein via a partition wall, that extends in a vertical direction and guides water entered therein to a vertically downward, wherein the casing includes a water-preventing rib that is provided in the guiding space, and that guides water guided vertically downside in the guiding space, in a direction of avoiding from an avoidance target portion that is positioned vertically below the guiding space.

The above and other objects, features, advantages and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Embodiments according to the present invention will now be described in detail with reference to the accompanying drawings. It is to be noted that the present invention is not limited to the embodiments. Further, the constituents of the embodiments below include constituents that can be easily replaced by those skilled in the art and constituents substantially same as the constituents of the embodiments.

First Embodiment

Figure 1:
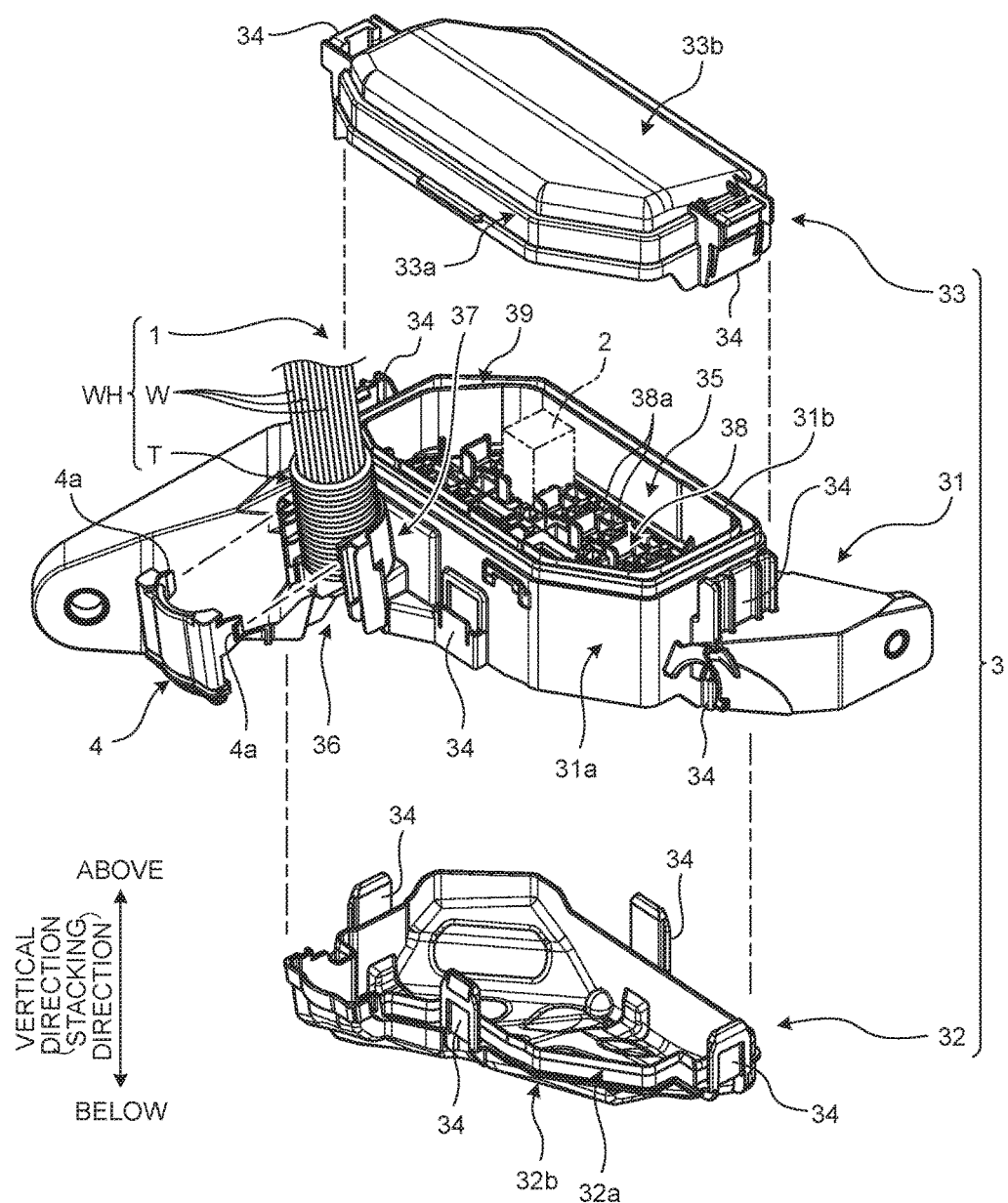
FIG. 1 is an exploded perspective view illustrating a schematic configuration of an electrical connection box according to a first embodiment.
Figure 2:
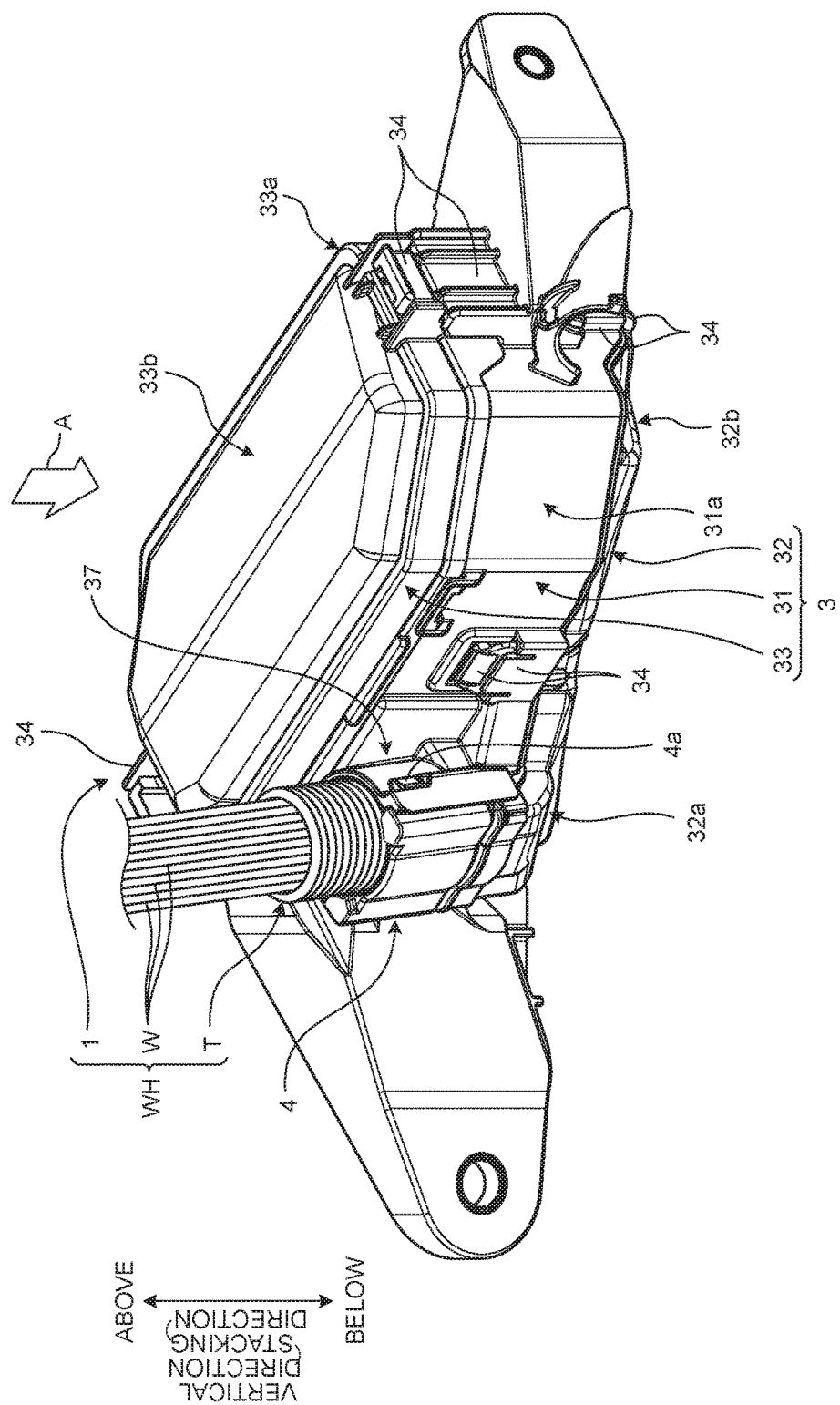
FIG. 2 is a perspective view illustrating a schematic configuration of the electrical connection box according to the first embodiment.
Figure 3:
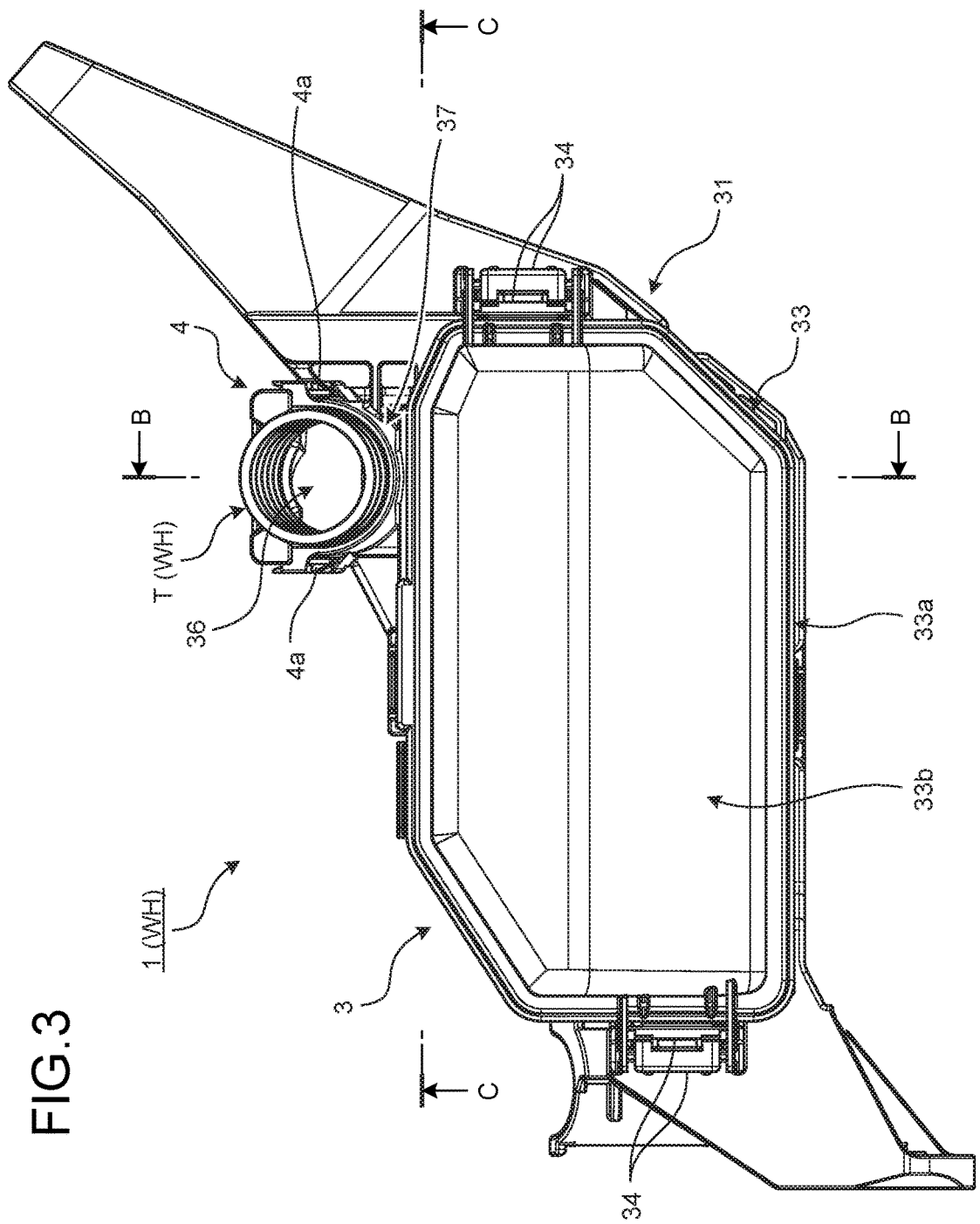
FIG. 3 is a fragmentary view taken in the direction of the arrow A in FIG. 2.
Figure 4:
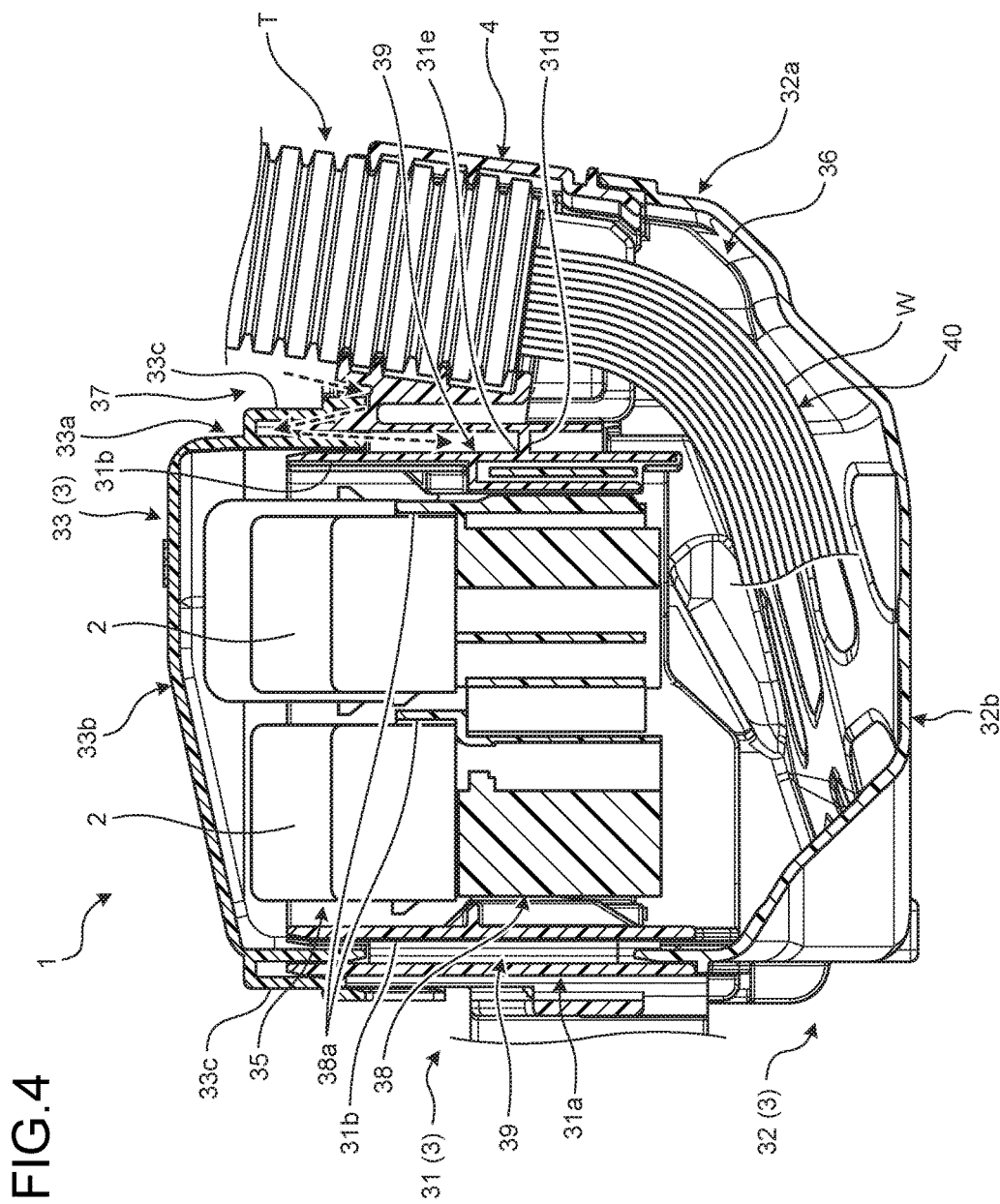
FIG. 4 is a sectional view cut along the line B-B in FIG. 3.
Figure 5:
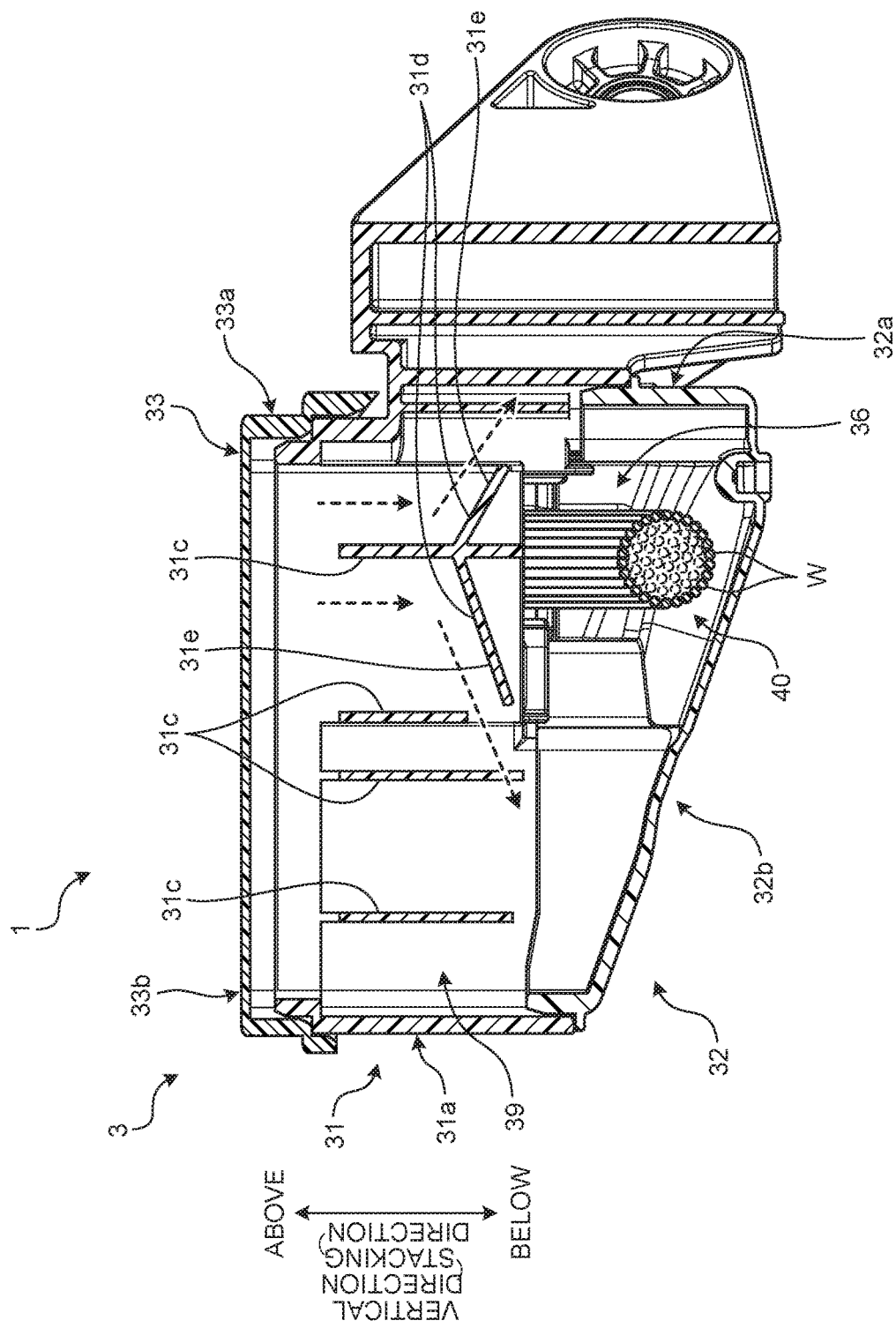
FIG. 5 is a sectional view cut along the line C-C in FIG. 3.

FIG. 1 is an exploded perspective view illustrating a schematic configuration of an electrical connection box according to a first embodiment. FIG. 2 is a perspective view illustrating a schematic configuration of the electrical connection box according to the first embodiment. FIG. 3 is a fragmentary view (top view) taken in the direction of the arrow A in FIG. 2. FIG. 4 is a sectional view cut along the line B-B in FIG. 3. FIG. 5 is a sectional view cut along the line C-C in FIG. 3. In FIG. 1, to make it easier to understand, a part of electrical components accommodated in the electrical connection box is indicated in alternate long and two short dashes line. Also, to make it easier to understand, a part or all of electric wires are not illustrated in FIG. 1, FIG. 3, FIG. 4, and FIG. 5.

An electrical connection box 1 illustrated in FIG. 1, FIG. 2, FIG. 3, and FIG. 4 is installed in a vehicle such as an automobile, and built into a wire harness WH. The electrical connection box 1 integrates and accommodates therein electric components such as a connector, a fuse, a relay, a branch portion, and an electronic control portion that configure connection treating components such as an electric wire. For example, the electrical connection box 1 is provided in an engine room of a vehicle or a lower portion of a vehicle body, and is connected to and interposed between a power source such as a battery and various electronic devices installed in the vehicle. The electrical connection box 1 distributes electric power supplied from the power source to various electronic devices in the vehicle. The electrical connection box 1 is also referred to as a junction box, a fuse box, a relay box, and the like, but in the present embodiment, these are collectively called an electrical connection box. In the following, unless otherwise specified, the direction is given under the assumption that the electrical connection box 1 is being installed in the vehicle.

For example, the wire harness WH is used to establish a connection between the devices installed in a vehicle. The wire harness WH is an assembly in which a plurality of electric wires W, which are used to supply electric power or for signal communication, are bundled together, so that the electric wires W are connected to the devices all at once by a connector and the like. The wire harness WH includes the electric wires W, a corrugated tube T that is an exterior member externally fitted to the electric wires W, and the electrical connection box 1 that is electrically connected to the electric wires W. For example, the electric wires W includes a conductor (core wire) obtained by twisting a plurality of conductive metal strands, and an insulating coating that covers the outside of the conductor. The corrugated tube T is a flexible tube (pipe), and in this example, is formed in a cylindrical shape. Typically, the corrugated tube T is formed in a bellows shape, and a plurality of uneven portions are formed on the outer peripheral surface thereof in the circumferential direction. The electric wires W are inserted into the corrugated tube T. The wire harness WH is obtained by bundling the electric wires W together to be an assembly, and the corrugated tube T is fitted to the outside of the bundled electric wires W. Also, the electrical connection box 1 is electrically connected to the end of the bundled electric wires W via the connector or the like as a connection portion. The wire harness WH may also include a grommet, a protector, a fixture, and the like.

The electrical connection box 1 includes electronic components 2, a casing 3 that accommodates the electronic components 2, and a corrugated cover 4 that is a cover member fitted to the casing 3. In the electrical connection box 1, various electronic components 2 are accommodated in an accommodating space 35 in the casing 3. The casing 3 in the electrical connection box 1 has an insertion opening 36. The electric wires W, which are electrically connected to the electronic components 2 accommodated in the casing 3, are inserted into and extracted from the casing 3 through the insertion opening 36. The electric wires W are bent outside the insertion opening 36 and extended along a wall (a side wall 31a, which will be described below) of the casing 3 with the corrugated tube T. For example, in the electrical connection box 1, because the corrugated cover 4 is fitted to the casing 3, an end of the corrugated tube T is held between the casing 3 and the corrugated cover 4. Thus, for example, in the electrical connection box 1, even if the number or the diameter of the electric wires W, which are routed in the electrical connection box 1, are changed, it is possible to prevent water from directly entering the casing 3 through the insertion opening 36. This is possible because the end of the corrugated tube T is held at the insertion opening 36. Hereinafter, each configuration of the electrical connection box 1 will be specifically described with reference to the accompanying drawings.

The electronic components 2 are accommodated inside the casing 3, and are electrically connected to the electric wires W. The electronic components 2 are provided in multiple numbers. For example, each of the electronic components 2 is a connector, a fuse, a relay, a branch portion, an electronic control portion, an electronic component portion, and the like. The electronic component portion is obtained by unitizing the connector, the fuse, the relay, the branch portion, and the electronic control portion.

The casing 3 includes the accommodating space 35 that is formed therein and that accommodates the electronic components 2. The casing 3 includes a frame 31 as a first member, a lower cover 32 as a second member, and an upper cover 33 as a third member. The casing 3 has a three-layer divided structure in which the frame 31, the lower cover 32, and the upper cover 33 are divided. In the casing 3, the frame 31, the lower cover 32, and the upper cover 33 are stacked in a predetermined stacking direction, fitted to each other, and partition the accommodating space 35 that accommodates the electronic components 2 therein. The frame 31, the lower cover 32, and the upper cover 33 are made of insulating synthetic resin.

The frame 31 is a principle member that forms the accommodating space 35 in which the electronic components 2 are fitted. The frame 31 is formed in a hollow shape by the side wall 31a that is a wall having a polygonal tube shape (rectangular tube shape). While the electrical connection box 1 is connected to the engine room and the like, openings are disposed in the vertically upper side and vertically downside of the frame 31. The lower cover 32 is a plate-like (tray-like) member that closes the opening on the vertically downside of the frame 31. The lower cover 32 is formed in a hollow shape by a side wall 32a that is a wall having a polygonal tube shape (rectangular tube shape), and a base portion 32b that closes one opening (opening in the vertically downside) of the side wall 32a. The upper cover 33 is a lid-shaped member that covers the opening in the vertically upper side of the frame 31. The upper cover 33 is formed in a hollow shape by a side wall 33a that is a wall having a polygonal tube shape (rectangular tube shape), and a ceiling portion 33b that closes the other opening (opening on the vertically upper side) of the side wall 33a. In the casing 3, the opening on the vertically downside of the frame 31 and the opening of the lower cover 32 face each other. Also, the opening on the vertically upper side of the frame 31 and the opening of the upper cover 33 face each other. The lower cover 32 is fitted on the vertically downside of the frame 31, and the upper cover 33 is fitted on the vertically upper side of the frame 31. In the casing 3, the frame 31 is locked to the upper cover 33 and the lower cover 32 via a locking mechanism 34 of various forms. Typically, while the electrical connection box 1 is connected to the engine room and the like, the stacking direction toward which the frame 31, the upper cover 33, and the lower cover 32 are stacked, is in the vertical direction. However, depending on the installation status of the electrical connection box 1, the stacking direction may be set with a predetermined angle relative to the vertical direction.

The casing 3 configured by the frame 31, the lower cover 32, and the upper cover 33 includes the accommodating space 35, the insertion opening 36, and an exterior installation portion 37.

The accommodating space 35 is a space partitioned by and surrounded by the frame 31, the lower cover 32, and the upper cover 33. In other words, in the accommodating space 35, a direction intersecting the vertical direction is partitioned by the side wall 31a of the frame 31, the side wall 32a of the lower cover 32, and the side wall 33a of the upper cover 33. The downside in the vertical direction of the accommodating space 35 is partitioned by the base portion 32b of the lower cover 32, and the upper side in the vertical direction of the accommodating space 35 is partitioned by the ceiling portion 33b of the upper cover 33. In the electrical connection box 1, a block 38 is provided in the accommodating space 35. The block 38 is removably fitted to the frame 31. Similarly to the frame 31 and the like, the block 38 is made of synthetic resin, and a plurality of cavities 38a are formed thereon. The electronic components 2 are fitted in the cavities 38a. Each of the electronic components 2 is inserted and fitted to each of the cavities 38a from vertically above the block 38, and terminals that form terminals of the electric wires W are inserted and fitted from vertically below the block 38. Thus, the electronic components 2 are electrically connected to the electric wires W.

The insertion opening 36 is used to insert and extract the electric wires W, which are connected to the electronic components 2 in the accommodating space 35, into and from the casing 3, in other words, into and from the accommodating space 35. In this example, the insertion opening 36 is formed on the frame 31. In the frame 31, the insertion opening 36 is formed on a wall in a direction intersecting the stacking direction, in other words, on one of the wall surfaces that configure the side wall 31a. The insertion opening 36 is formed on an end on the vertically downside of the frame 31, in other words, on an end of the side to which the lower cover 32 is provided. While the lower cover 32 is fitted to the frame 31, the insertion opening 36 is opened vertically upward. The electric wires W connected to the electronic components 2 in the accommodating space 35 are inserted into and extracted from the casing 3 through the insertion opening 36, to be routed.

The exterior installation portion 37 is formed outside the insertion opening 36 of the frame 31, and the end of the corrugated tube T is provided in the stacking direction. In the frame 31, the exterior installation portion 37 is provided on a wall in a direction intersecting the stacking direction, in other words, on a wall surface on which the insertion opening 36 described above is formed, among the wall surfaces that configure the side wall 31a. In the frame 31, the exterior installation portion 37 is integrally formed with the side wall 31a, so as to expose to the outside, which is the side opposite from the inside in which the accommodating space 35 is formed. The exterior installation portion 37 includes a semi-cylindrical portion formed along the exterior of the corrugated tube T, and the end of the corrugated tube T is provided at the inner peripheral surface side thereof.

The corrugated cover 4 is fitted to the casing 3, and the end of the corrugated tube T is held between the casing 3 and the corrugated cover 4. Similarly to the frame 31 and the like, the corrugated cover 4 is made of synthetic resin, and includes a semi-cylindrical portion formed along the exterior of the corrugated tube T. The corrugated cover 4 is locked to the exterior installation portion 37 via a pair of locking portions 4a, and the corrugated cover 4 and the frame 31 hold the end of the corrugated tube T, which is interposed therebetween.

As illustrated in FIG. 1 and FIG. 4, in the electrical connection box 1 of the present embodiment, the frame 31 has a double wall structure. Thus, the electrical connection box 1 prevents water that has entered in the casing 3 via a gap of the connection portion between the frame 31 and the upper cover 33, from entering the side of the accommodating space 35 in which the electronic components 2 are accommodated. This is possible by guiding the water vertically downward via a space (a guiding space 39, which will be described below) inside the double walls.

More specifically, in the electrical connection box 1, the casing 3 includes the guiding space 39. In the casing 3, the guiding space 39 is partitioned horizontally next to the accommodating space 35 therein via a partition wall 31b. The guiding space 39 extends in the vertical direction and guides the water having entered therein vertically downward. The partition wall 31b is a wall smaller than the side wall 31a and has a polygonal tube shape (rectangular tube shape). The partition wall 31b is formed inside the side wall 31a of the frame 31, at an interval from the side wall 31a. The outer surface of the partition wall 31b faces the inner surface of the side wall 31a in the horizontal direction, and the partition wall 31b is integrally formed with the side wall 31a, via a rib 31c (see FIG. 5). The rib 31c is interposed between the partition wall 31b and the side wall 31a, and connects therebetween. As illustrated in FIG. 5, the rib 31c extends in the stacking direction (vertical direction). In this example, a plurality of ribs 31c are provided at intervals in the horizontal direction. In the frame 31, space between the side wall 31a and the partition wall 31b is formed as the guiding space 39. The partition wall 31b and the guiding space 39, which is partitioned by the partition wall 31b, are formed so as to horizontally surround the accommodating space 35 (however, it shall be permitted that there is a portion without the guiding space 39). In other words, in the frame 31 of the casing 3, the side wall 31a configures the outer wall of the double wall structure, and the partition wall 31b configures the inner wall thereof.

In the casing 3, the connection portion between the frame 31 and the upper cover 33 has a labyrinth-like structure. This prevents water from entering through the gap of the connection portion between the frame 31 and the upper cover 33. More specifically, in the upper cover 33, an outside wall 33c is formed on the surface outside the side wall 33a. The outside wall 33c is integrally formed with the side wall 33a at an interval from the side wall 33a in the horizontal direction. In the casing 3, while the upper cover 33 is fitted to the frame 31, an end on the vertically downside of the side wall 31a of the frame 31 is inserted into a space between the side wall 33a and the outside wall 33c of the upper cover 33. Also, an end on the vertically downside of the side wall 33a of the upper cover 33 is inserted into space between the side wall 31a and the partition wall 31b of the frame 31, in other words, into the guiding space 39. Thus, the casing 3 configures an overlapping portion by overlapping the partition wall 31b, the side wall 33a, the side wall 31a, and the outside wall 33c in this order from the inside of the casing 3 toward the outside thereof. Consequently, the electrical connection box 1 has a complex labyrinth-like structure in which the side wall 31a and the partition wall 31b of the frame 31 as well as the side wall 33a and the outside wall 33c of the upper cover 33 are alternately overlapped with each other in the inward and outward direction of the casing 3. Thus, it is possible to prevent water from entering the side of the accommodating space 35 from the outside through the gap between the frame 31 and the upper cover 33. Also, even if water has entered in the casing 3 through the gap of the connection portion between the frame 31 and the upper cover 33, the electrical connection box 1 can prevent the water from entering the side of the accommodating space 35 in which the electronic components 2 are accommodated. This is possible by guiding the water vertically downward via the guiding space 39.

Because the casing 3 of the present embodiment further includes a water-preventing rib 31d in the guiding space 39, it is possible to suitably treat the water that has entered in the casing 3.

More specifically, as illustrated in FIG. 4 and FIG. 5, the water-preventing rib 31d is provided in the guiding space 39. The water-preventing rib 31d guides the water that has been guided vertically downward in the guiding space 39, in a direction to avoid an avoidance target portion 40 set in advance. In this example, the avoidance target portion 40 is positioned vertically below the guiding space 39, and is a material with which water is preferably avoided from coming into contact. The avoidance target portion 40 includes the electric wires W that are inserted through the insertion opening 36 and that cross vertically below the guiding space 39, as the material with which water is preferably avoided from coming into contact. The water-preventing rib 31d includes an inclined surface 31e that is positioned vertically above the avoidance target portion 40, in this example, the electric wires W that cross vertically below the guiding space 39, and that extends to a position deviated from vertically above the avoidance target portion 40. The water-preventing rib 31d is integrally formed with the side wall 31a and the partition wall 31b, and is interposed therebetween. The water-preventing rib 31d has a stick-like shape. In this example, there are a total of two water-preventing ribs 31d, and each of the water-preventing ribs 31d is provided at each side of the rib 31c in the horizontal direction. The rib 31c is positioned vertically above the electric wires W that cross vertically below the guiding space 39. Each of the water-preventing ribs 31d intersects the vertical direction, and an end of the water-preventing ribs 31d at the side of the rib 31c is positioned vertically above the other end, and the other end of the water-preventing ribs 31d is positioned vertically below the end at the side of the rib 31c. Thus, the inclined surface 31e that extends to the position deviated from vertically above the avoidance target portion 40, in this example, the electric wires W that cross vertically below the guiding space 39, is formed on the surface vertically above the avoidance target portion 40, or the electric wires W. Hence, in a portion vertically above the avoidance target portion 40, the inclined surface 31e guides the water that has been guided vertically downward in the guiding space 39 in the direction to avoid the avoidance target portion 40, in this example, to the position deviated from vertically above the avoidance target portion 40.

For example, as illustrated by the arrows in FIG. 4, in the electrical connection box 1 configured as above, even if the water has entered in the casing 3 via the gap of the connection portion between the frame 31 and the upper cover 33, the water that has entered in the casing 3 is guided vertically downward via the guiding space 39. Consequently, it is possible to prevent the water from entering the side of the accommodating space 35 in which the electronic components 2 are accommodated. In this configuration, in the electrical connection box 1, as illustrated by the arrows in FIG. 5, the water-preventing rib 31d guides the water that has been guided vertically downward in the guiding space 39 in the direction to avoid the avoidance target portion 40. More specifically, in the electrical connection box 1, the water guided vertically downward in the guiding space 39 is moved on the inclined surface 31e of the water-preventing rib 31d by its own weight, and is guided to the position deviated from vertically above the avoidance target portion 40, in this example, the electric wires W that cross vertically below the guiding space 39. As a result, the electrical connection box 1 can prevent the water that has been guided vertically downward in the guiding space 39, from adhering to the electric wires W that cross vertically below the guiding space 39. The electrical connection box 1 can also prevent the water from being splashed by the electric wires W. In the electrical connection box 1, the water that has been guided vertically downward in the guiding space 39 and that is dropped onto the base portion 32b of the lower cover 32 is suitably treated, for example, by being discharged outside the casing 3 from a discharge port (not illustrated) formed on the base portion 32b, and the like.

The electrical connection box 1 described above is provided with the casing 3. The casing 3 includes the accommodating space 35 that is formed therein and that accommodates the electronic components 2. The casing 3 also includes the guiding space 39 that is partitioned horizontally next to the accommodating space 35 therein via the partition wall 31b, and that extends in the vertical direction and guides the water having entered therein vertically downward. The wire harness WH described above includes the electric wires W and the electrical connection box 1 that accommodates the electronic components 2 connected to the electric wires W. The casing 3 includes the water-preventing rib 31d that is provided in the guiding space 39 and that guides the water having been guided vertically downward in the guiding space 39, in the direction to avoid the avoidance target portion 40 that is positioned vertically below the guiding space 39.

Subsequently, in the electrical connection box 1 and the wire harness WH, the water that has entered in the casing 3 is guided and treated vertically downward, by the guiding space 39 that is partitioned horizontally next to the accommodating space 35, which accommodates the electronic components 2, via the partition wall 31b. In this configuration, in the electrical connection box 1 and the wire harness WH, the water-preventing rib 31d that is provided in the guiding space 39 guides the water having been guided vertically downward in the guiding space 39, in the direction to avoid the avoidance target portion 40 that is positioned vertically below the guiding space 39. Thus, the electrical connection box 1 and the wire harness WH can prevent the water that has been guided in the guiding space 39 from adhering to the avoidance target portion 40, as well as the avoidance target portion 40 from coming into contact with the water. With this configuration, the electrical connection box 1 and the wire harness WH can treat the water that has entered in the casing. Also, because the electrical connection box 1 and the wire harness WH can prevent the avoidance target portion 40 from coming into contact with water, it is possible to prevent the water that drops inside the guiding space 39 from being splashed by the avoidance target portion 40. Hence, for example, it is possible to reliably prevent the water from splashing to the side of the accommodating space 35 in which the electronic components 2 are accommodated. As a result, the electrical connection box 1 and the wire harness WH can suitably treat the water that has entered in the casing 3.

With the electrical connection box 1 and the wire harness WH described above, the casing 3 includes the insertion opening 36 through which the electric wires W connected to the electronic components 2 are inserted. The avoidance target portion 40 includes the electric wires W that are inserted through the insertion opening 36 and that cross vertically below the guiding space 39. The water-preventing rib 31d includes the inclined surface 31e that is positioned vertically above the avoidance target portion 40, and that extends to the position deviated from vertically above the avoidance target portion 40. Consequently, even if the insertion opening 36 of the electric wires W is arranged vertically below the guiding space 39, and the electric wires W cross vertically below the guiding space 39, the electrical connection box 1 and the wire harness WH can move the water that has been guided vertically downward in the guiding space 39 on the inclined surface 31e of the water-preventing rib 31d by its own weight. As a result, because it is possible to guide the water to the position deviated from vertically above the electric wires W, which is the avoidance target portion 40, the electrical connection box 1 and the wire harness WH can suitably treat the water that has entered in the casing 3.

Second Embodiment

Figure 6:
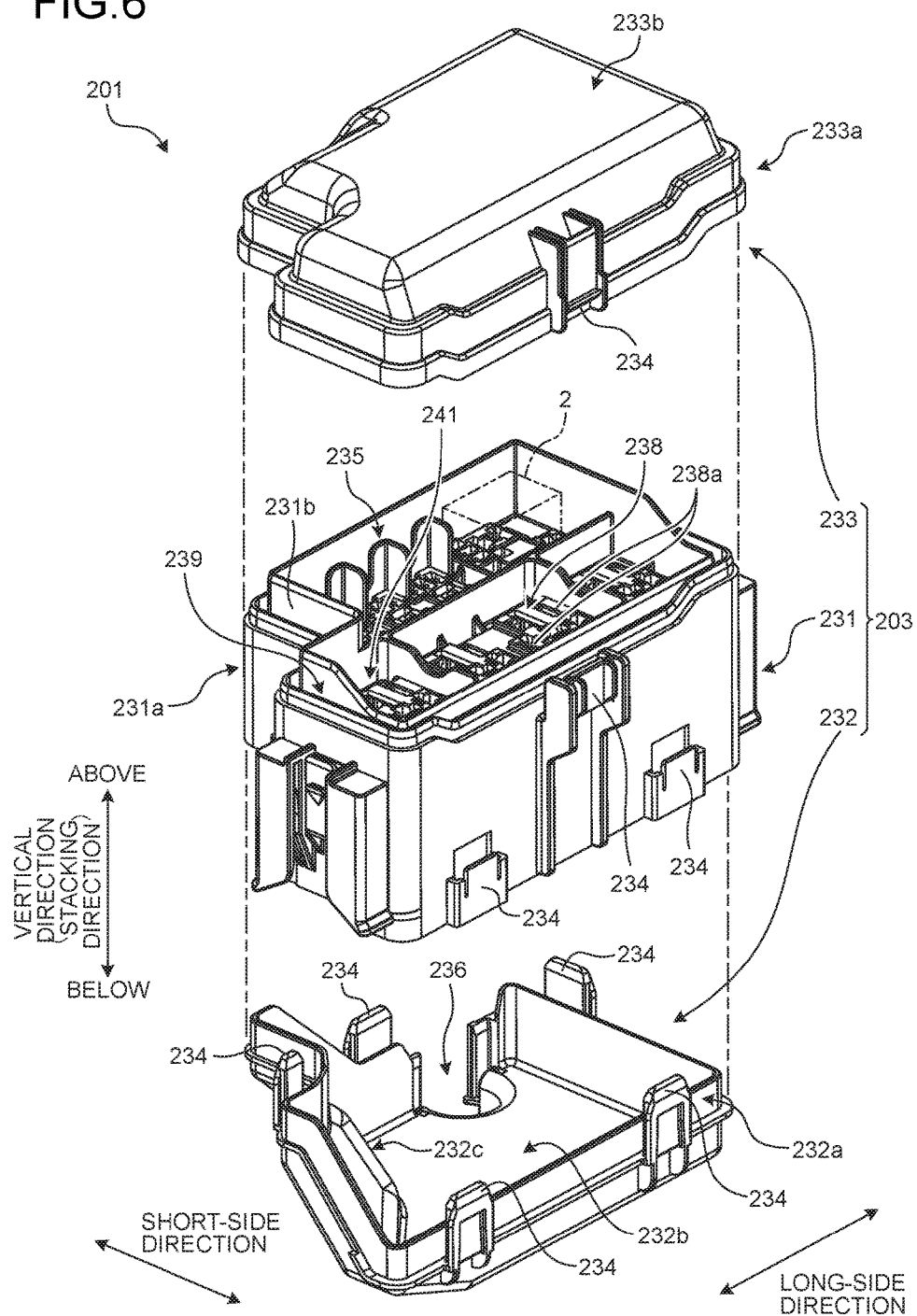
FIG. 6 is an exploded perspective view illustrating a schematic configuration of an electrical connection box according to a second embodiment.
Figure 7:
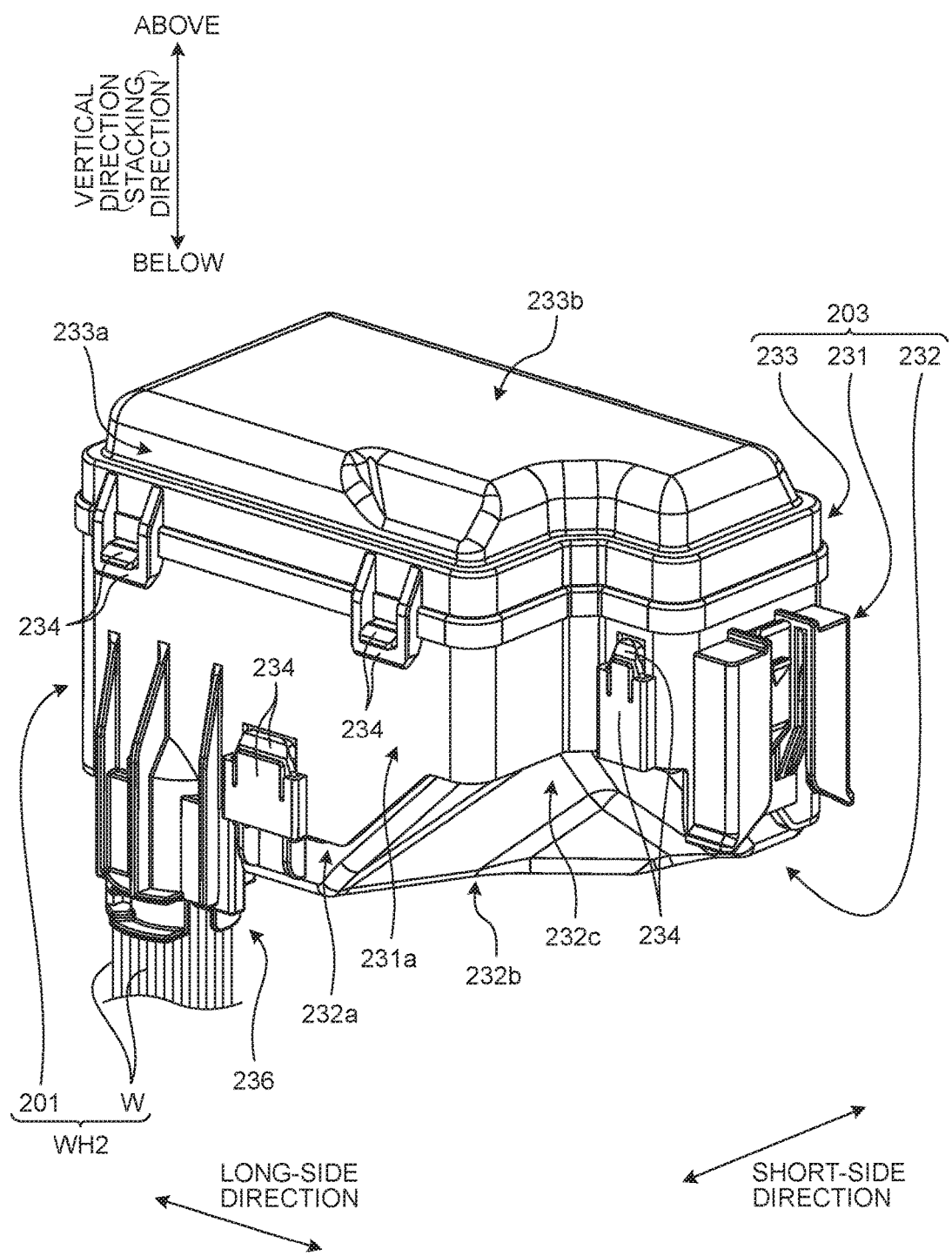
FIG. 7 is a perspective view illustrating the schematic configuration of the electrical connection box according to the second embodiment.
Figure 8:
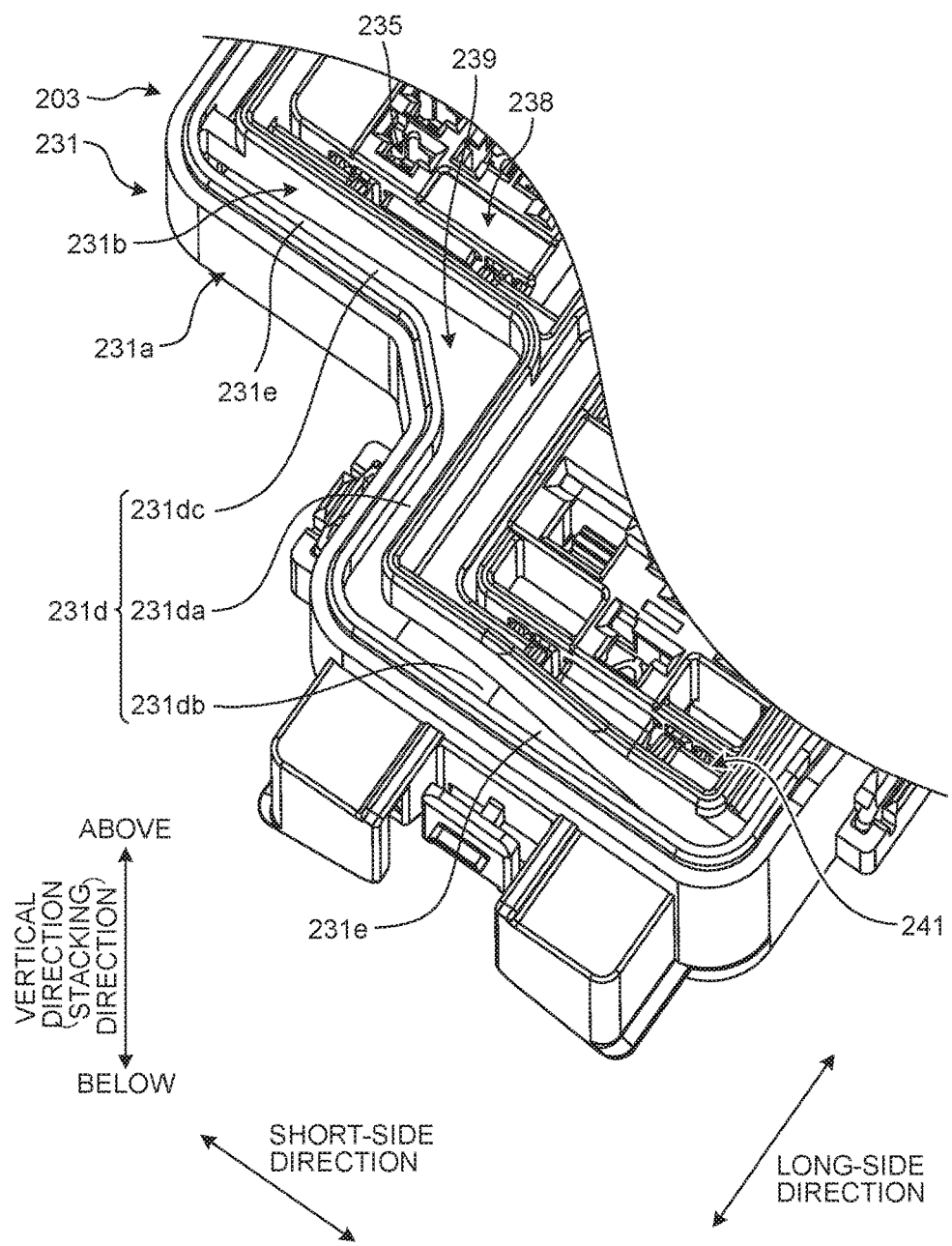
FIG. 8 is a partial perspective view illustrating the schematic configuration of the electrical connection box according to the second embodiment.
Figure 9:
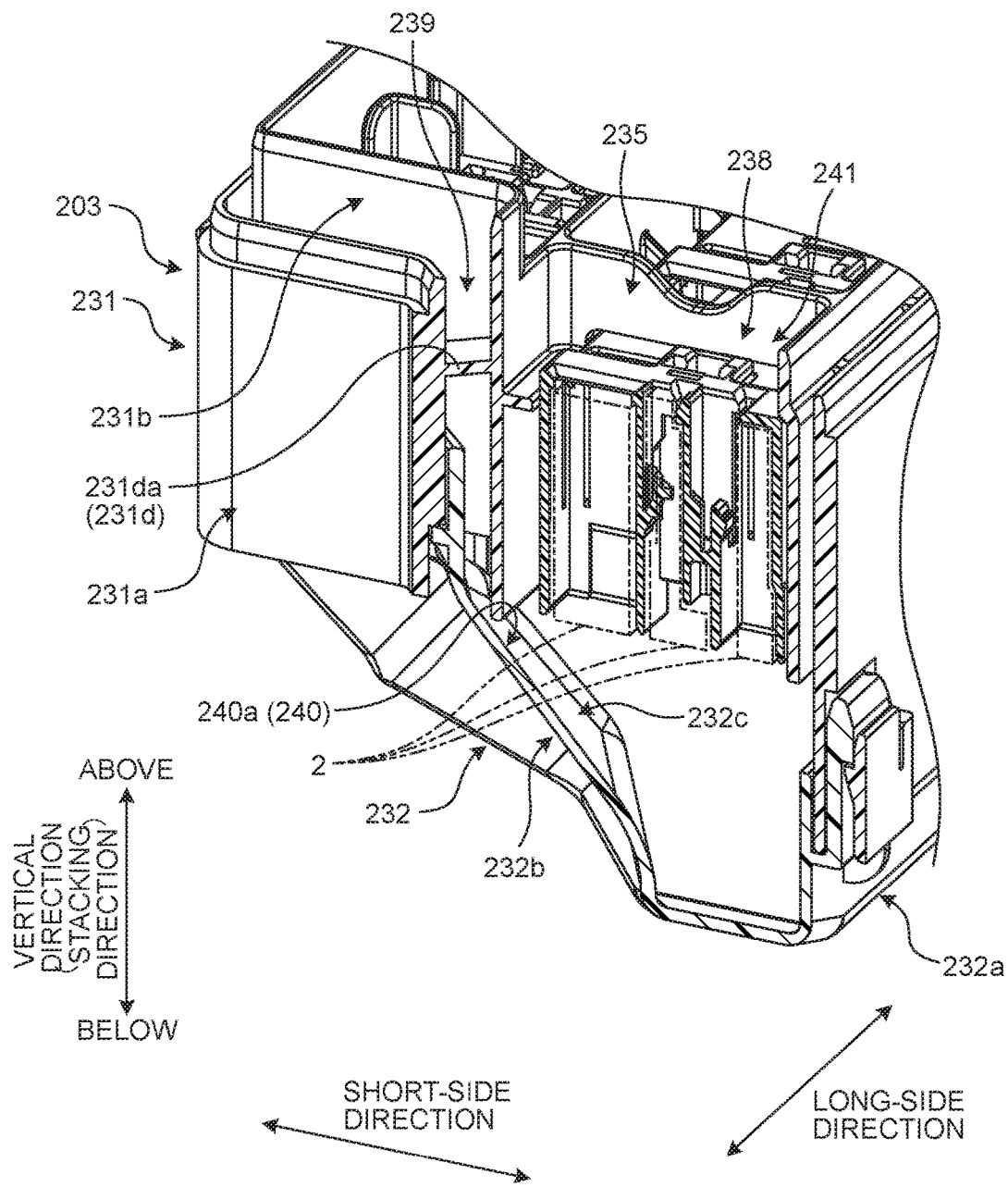
FIG. 9 is a partial sectional perspective view illustrating the schematic configuration of the electrical connection box according to the second embodiment.
Figure 10:
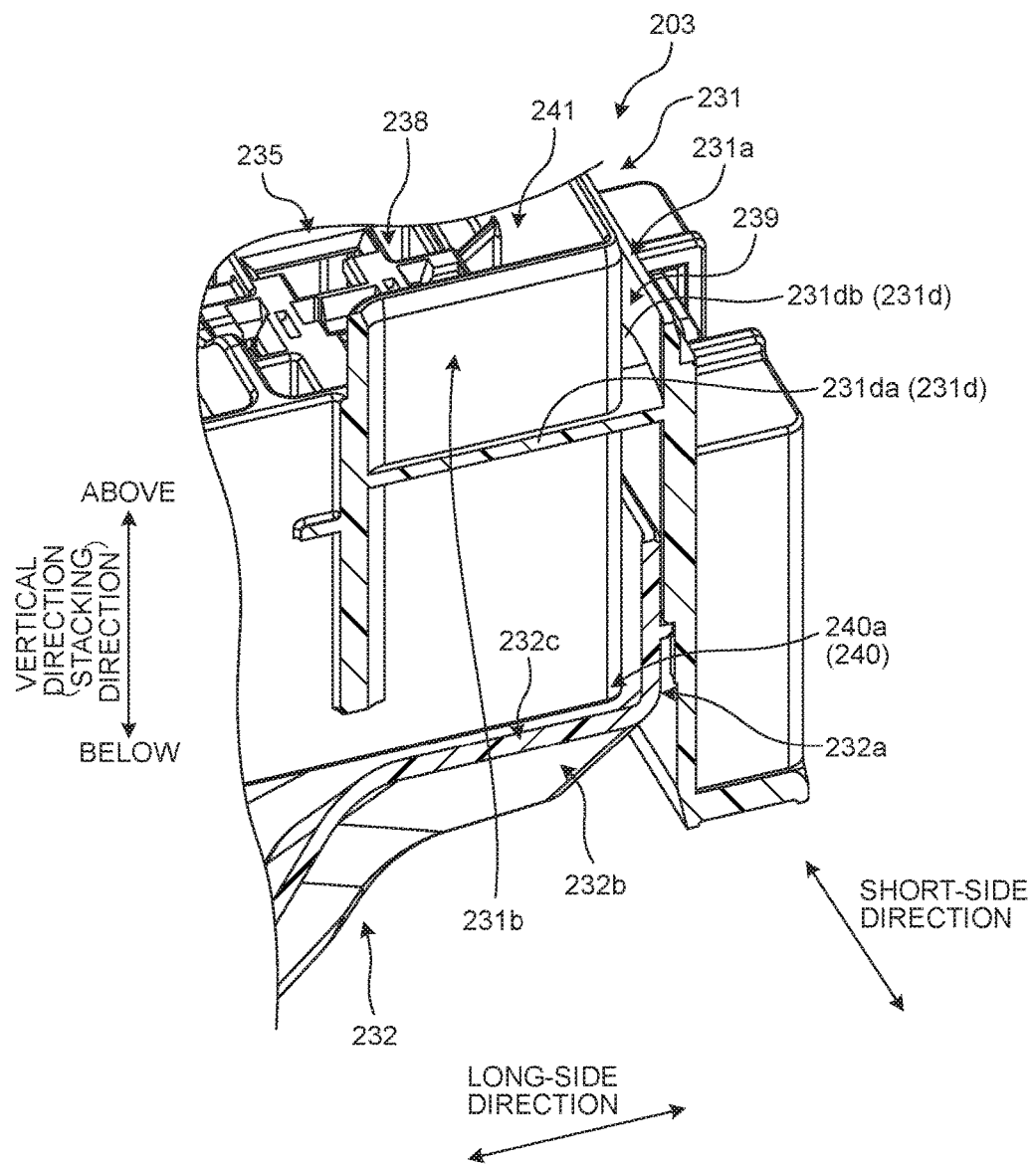
FIG. 10 is a partial sectional perspective views illustrating the schematic configuration of the electrical connection box according to the second embodiment.
Figure 11:
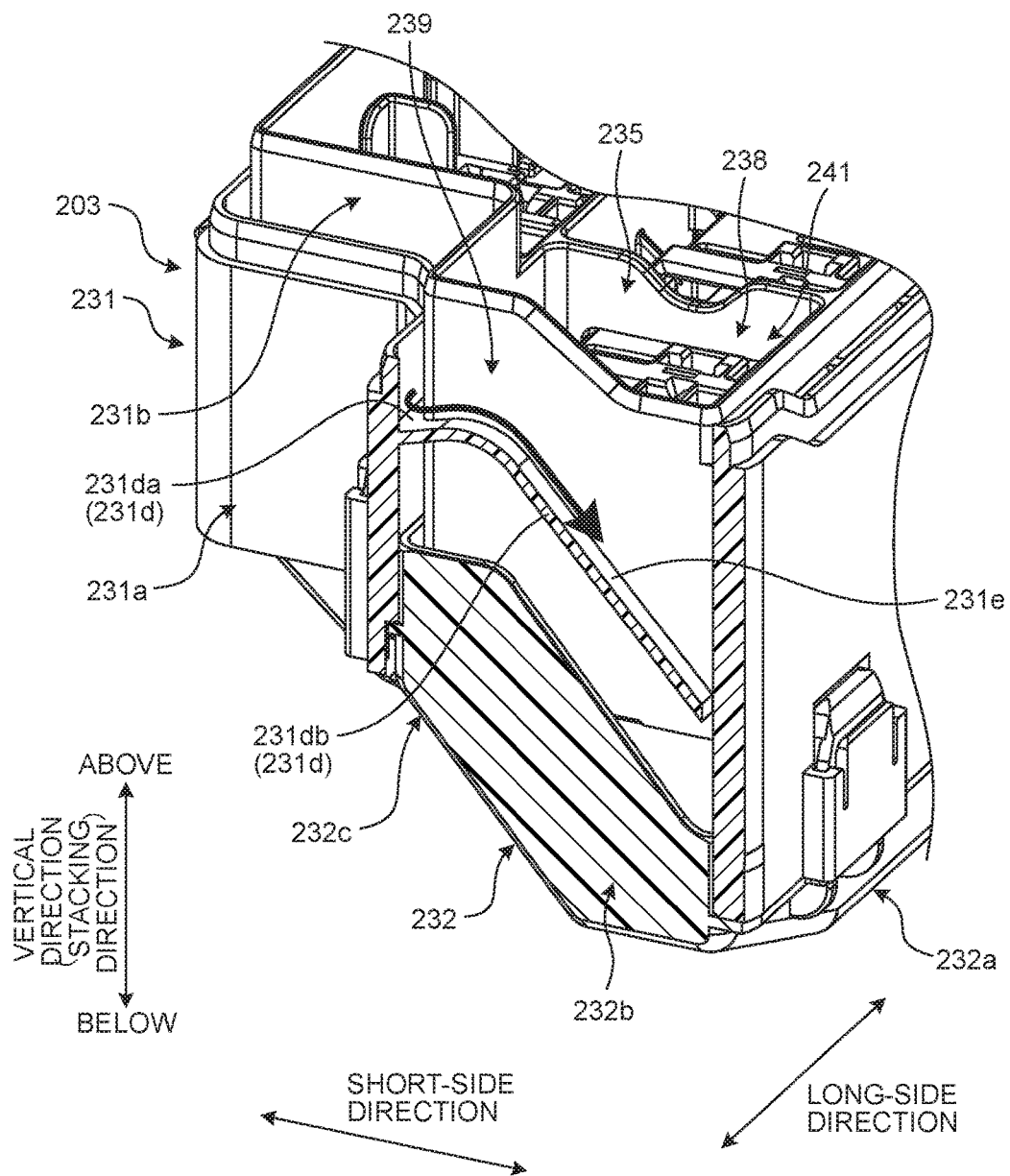
FIG. 11 is a partial sectional perspective views illustrating the schematic configuration of the electrical connection box according to the second embodiment.
Figure 12:
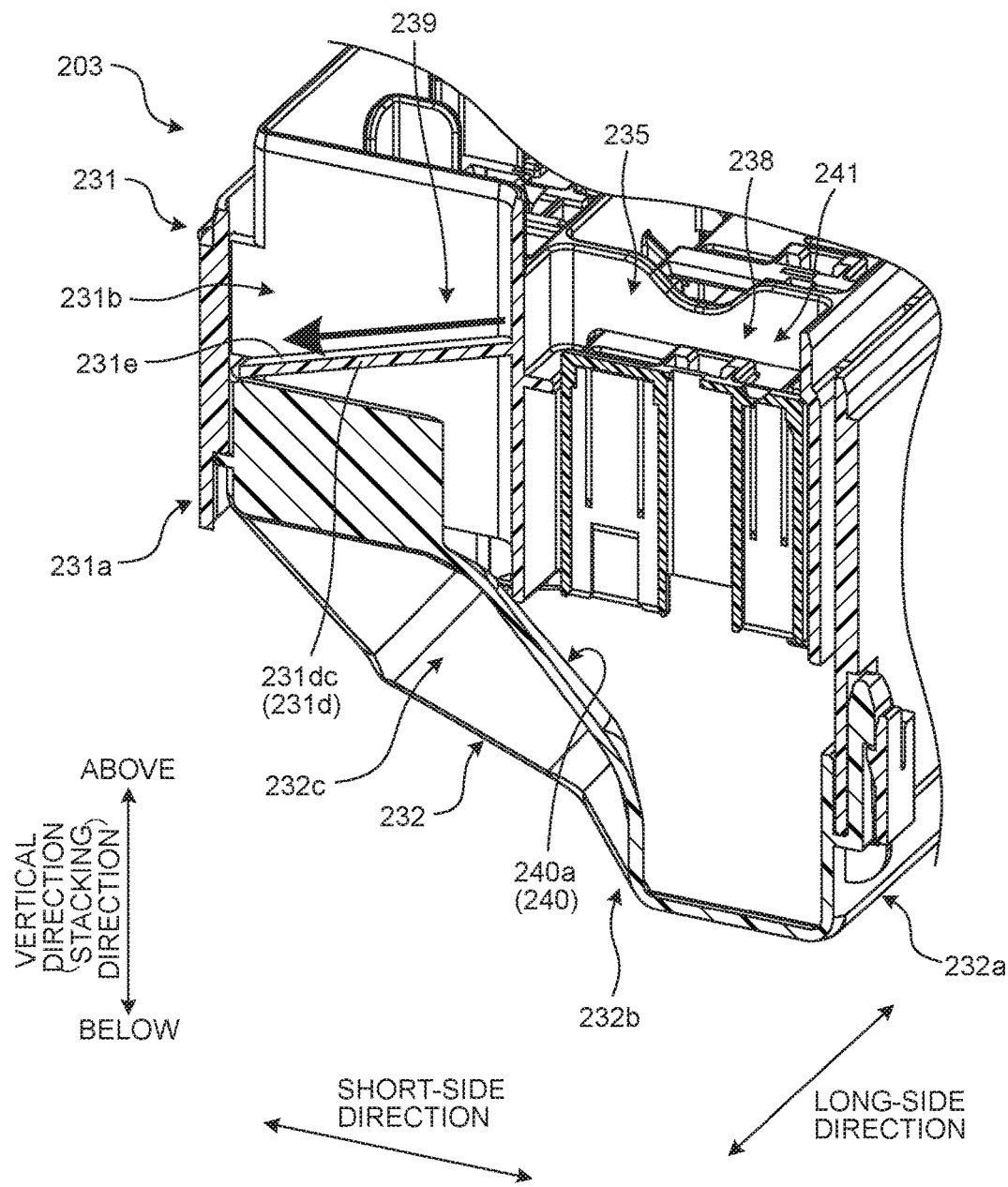
FIG. 12 is a partial sectional perspective views illustrating the schematic configuration of the electrical connection box according to the second embodiment.

FIG. 6 is an exploded perspective view illustrating a schematic configuration of an electrical connection box according to a second embodiment. FIG. 7 is a perspective view illustrating the schematic configuration of the electrical connection box according to the second embodiment. FIG. 8 is a partial perspective view illustrating the schematic configuration of the electrical connection box according to the second embodiment. FIG. 9, FIG. 10, FIG. 11, and FIG. 12 are partial sectional perspective views illustrating the schematic configuration of the electrical connection box according to the second embodiment. In the electrical connection box and a wire harness according to the second embodiment, an avoidance target portion differs from that in the first embodiment. In the following description, common reference numerals are attached to similar components to that in the above-mentioned embodiment, and the duplicated description with respect to the common configuration, operation, and effects is omitted as much as possible. Note that, in the following description, a part of electronic components accommodated in the electrical connection box is shown by the alternate long and two short dashes line in FIG. 6 and FIG. 9 to facilitate understanding, and the electronic components are not shown in other drawings. An upper cover is not shown in FIG. 8, FIG. 9, FIG. 10, FIG. 11, and FIG. 12 to facilitate understanding.

In the electrical connection box 201 and the wire harness WH2 according to the present embodiment as shown in FIG. 6 and FIG. 7 and so on, an avoidance target portion 240 differs from that in the electrical connection box and the wire harness WH2 as described above. In addition, the configuration of a casing 203 etc. other than the avoidance target portion 240 in the electrical connection box 201 and the wire harness WH2 differs from that in the electrical connection box 201 and the wire harness WH2 as described above.

The electrical connection box 201 shown in FIG. 6 and FIG. 7 etc. is assembled to the wire harness WH2, similarly to the electrical connection box 1. The wire harness WH2 includes a plurality of electric wires W and the electrical connection box 201 electrical connected to the electric wires W. Here, the wire harness WH2 does not have a corrugated tube T (see FIG. 1, but not shown therein) as an exterior member externally fitted to the electric wires W.

The electrical connection box 201 in the present embodiment has a casing 203 that accommodates the electronic components 2, instead of the casing 3 (see FIG. 1) described above and does not have the corrugated cover 4 (see FIG. 1 etc.) as described above. In the electrical connection box 201, the casing 203 has an accommodating space 235 in an inside thereof in which various electronic components 2 are accommodated. In the electrical connection box 201, the casing 203 has an insertion opening 236, and the electric wires W electrically connected to the electronic components 2 accommodated in the casing 203 is passed in the inside and outside of the casing through the insertion opening 236. Hereinafter, a configuration of the electrical connection box 201 is specifically described with reference to each drawing. Note that the casing 203 differs from the casing 3 in that it does not have a size, a shape, and the exterior installation portion 37, etc., but has substantially the similar configuration to the casing 3, thus omitting a description thereof as much as possible.

The casing 203 accommodates the electronic components 2 in the accommodating space 235 provided in the inside thereof, and includes a frame 231 as a first member, a lower cover 232 as a second member, an upper cover 233 as a third member. The frame 231 corresponds to the frame 31 (see FIG. 1 etc.) as described above, the lower cover 232 corresponds to the lower cover 32 (see FIG. 1 etc.) as described above, and the upper cover 233 corresponds to the upper cover 33 (see FIG. 1 etc.) as described above. The casing 203 is configured in manner that the frame 231, the lower cover 232, and the upper cover 233 are stacked along a predetermined stacking direction and assembled each other and partitions the accommodating space 235 accommodating the electronic components 2 therein. Herein, the casing 203 is formed in such a shape that a length along a long-side direction perpendicular to the stacking direction is relatively longer than a length along a short-side direction perpendicular to the stacking direction and the long-side direction.

The frame 231 is a main member forming the accommodating space 235 in which the electronic components 2 are assembled. The frame is formed in a hollow shape by a side wall 231a as a wall forming a polygonal cylindrical shape. The lower cover 232 is a dish-shaped (tray-shaped) member closing a lower opening of the frame 231 in a vertical direction. The lower cover 232 is formed in a hollow shape by a side wall 232a as a wall formed in a polygonal cylindrical shape and a bottom portion 232b closing one opening (lower opening in the vertical direction) of the side wall 232a. The upper cover 233 is a lid-shaped member closing an upper opening of the frame 231 in the vertical direction. The upper cover 233 is formed in a hollow shape by a side wall 233a as a wall formed in a polygonal cylindrical shape and a ceiling portion 233b closing one opening (upper opening in the vertical direction) of the side wall 233a. In the casing 203, the lower cover 232 is assembled to the downside of the frame 231 in the vertical direction and the upper cover 233 is assembled to the upper side of the frame 231 in the vertical direction such that the lower opening of the frame 231 in the vertical direction and an opening of the lower cover 232 face, and the upper opening of the frame 231 in the vertical direction and an opening of the upper cover 233 face. In the casing 203, the upper cover 233 and the lower cover 232 are engaged with the frame 231 through various types of engaging mechanisms 234.

Thus, the casing 203 configured by the frame 231, the lower cover 232, and the upper cover 233 has the accommodating space 235 and the insertion opening 236. In the accommodating space 235, a direction intersecting the vertical direction is partitioned by the side wall 231a of the frame 231, the side wall 232a of the lower cover 232, and the side wall 233a of the upper cover 233, the downside in the vertical direction is partitioned by the bottom portion 232b of the lower cover 233 and the upper side in the vertical direction is partitioned by the ceiling portion 233b of the upper cover 233. A block 238 provided with a plurality of cavities 238a is provided in the accommodating space 235 of the electrical connection box 201, and the electronic components 2 are assembled in the cavities 238a. The insertion opening 236 is provided at a position where the side wall 232a and the bottom portion 232b in the lower cover 232 intersect.

In the electrical connection box 201, the casing 203 has a guiding space 239, as shown in FIG. 6 etc. That is to say, the electrical connection box 201 includes the frame 231 having a double walled structure, similarly to the electrical connection box 1. This makes it possible to prevent water from invading into the accommodating space 235 in which the electronic components 2 are accommodated by guiding water entered an inside of the casing 203 through a clearance of a connection portion between the frame 231 and the upper cover 233 to a downside in the vertical direction through the guiding space 239 within the double wall. The guiding space 239 is divided by a partition wall 231b at a lateral in a horizontal direction of the accommodating space 235 in the inside of the casing 203, extends along the vertical direction, and guides the invaded water to the downside in the vertical direction. The partition wall 231b is a polygonal cylindrical wall smaller than the side wall 231a. The partition wall 231b is disposed at an interval from the side wall 231a in an inside of the side wall 231a of the frame 231. The partition wall 231b has an outer surface facing an inner surface of the side wall 231a with respect to a horizontal direction and is integrally attached to the side wall 231a through various ribs including a water-preventing rib 231d as described below. In the frame 231, a space formed between the side wall 231a and the partition wall 231b is used as the guiding space 239. The partition wall 231b and the guiding space 239 partitioned by the partition wall 231b are formed to surround the lateral of the accommodating space 235 in the horizontal direction (however, it is allowed that a portion where the accommodating space does not have in part exists). That is to say, in the frame 231 of the casing 203, the side wall 231a constitutes an outer wall of the double walled structure and the partition wall constitutes an inner wall of the double walled structure. Note that the casing 203 is also configured to suppress the inversion of water through the clearance of the connection portion between the frame 231 and the upper cover 233 by forming a labyrinth-shaped structure at the connection portion between the frame 231 and the upper cover 233, similarly to the casing 3 as described above. In the electrical connection box 201, even if water invades in the inside of the casing 203 through the clearance of the connection portion between the frame 231 and the upper cover 233, it is possible to prevent the water from invading into the accommodating space 235 in which the electronic components 2 are accommodated, by guiding the water to the downside in the vertical direction through the guiding space 239.

In the casing 203 of the present embodiment, the provision of the water-preventing rib 231d in the guiding space 239 makes it possible to properly treat water invaded in the inside of the casing 203, as shown in FIG. 8, FIG. 9, FIG. 10, FIG. 11, and FIG. 12.

Specifically, the water-preventing rib 231d is provided in the guiding space 239 and guides the water guided vertically below within the guiding space 239 in the avoided direction from the avoidance target portion 240 which is previously set. Here, the avoidance target portion 240 is positioned on the downside of the guiding space 239 in the vertical direction and is an object which is unfavorable when water is attached. The avoidance target portion 240 in the present embodiment includes a bottom proximity part 240a which is arranged to be closer to the electronic components 2 than a destination of avoidance of water by the water-preventing rib 231d, in the bottom potion 232b of the lower cover 232 positioned vertically below the guiding space 239, as the object which is unfavorable when water is attached. The bottom portion 232b of the lower cover 232 in the present embodiment includes a raised part 232c (see FIG. 6 and FIG. 7 etc.) provided to protrude to a side of the frame 231 in the stacking direction, in other words, to a side of the accommodating space 235. An inside of the raised part 232c, that is, a surface of the accommodating space 235 constitutes the bottom proximity part 240a close to the electronic components 2. The bottom proximity part 240a is positioned in a bulged part 241 in which the entirety of the casing 203 is formed to protrude in a substantially rectangular shape along the long-side direction, as viewed along the stacking direction (hereinafter, there is a case referred to as "stacking direction view"). The bottom proximity part 240a is typically a part including a top portion of the raised part 232c, in other words, a position including the closest part to the electronic components 2 side in the bottom portion 232b (in particular, see FIG. 9, FIG. 10 etc.).

The water-preventing rib 231d has an inclined surface 231e extending to a destination of avoidance of water which is positioned on the above in the vertical direction of the avoidance target portion 240, herein, the bottom proximity part 240a which is positioned on the downside of the guiding space 239 in the vertical direction and disposed to be closer to the electronic components 2 than the destination of avoidance of water by the water-preventing rib 231*d* is deviated from the above of the bottom proximity part 240*a* in the vertical direction, herein, positioned on a corner portion of the inside of the casing 203. The water-preventing rib 231*d* is integrally attached to the side wall 231*a* and the partition wall 231*b* therebetween. The water-preventing rib 231*d* is formed as a rod-shaped portion. Here, the water-preventing rib 231*d* includes a first rib 231*da*, a second rib 231*db*, and a third rib 231*dc*. The first rib 231*da* is positioned on the above of the bottom proximity part 240 in the vertical direction constituting the avoidance target portion 240, in other words, the above of the raised part 232*c* in the vertical direction, and is formed to extend along the long-side direction (see FIG. 9, FIG. 10, and FIG. 11 etc.). The first rib 231*da* is formed along a side positioned in a central side of the short-side direction of sides along the long-side direction of the bulged part 241. Herein, the first rib 231*da* is substantially horizontally formed to the long-side direction and is formed to be inclined in a manner that a side of the third rib 231*dc* as described below becomes the downside in the vertical direction to the short-side direction. The second rib 231*d* b is formed to extend along the short-side direction from one end portion of the first rib 231*da* in the long-side direction, herein, an end portion of a protruded leading end side of the bulged part 241 (see FIG. 11 etc.). The second rib 231*db* is formed along a side of the bulged part 241 along the short-side direction, more specifically, a side of the protruded leading end side of the bulged part 241 along the short-side direction (see FIG. 11 etc.). The second rib 231*db* is formed to continue to the first rib 231*da* and includes the inclined surface 231*e*. The inclined surface 231*e* of the second rib 231*db* extends from the end portion of the first rib 231*da* side to the corner portion of the inside of the casing 203 in one side of the short-side direction, which is the destination of avoidance of water by the water-preventing rib 231*d*. The inclined surface 231*e* of the second rib 231*db* is formed to be inclined such that the end portion of the first rib 231*da* side is positioned on the above in the vertical direction and the corner portion side of the inside of the casing 203 in the one side of the short-side direction, which is the destination of avoidance of water is positioned on the downside in the vertical direction. The third rib 231*dc* is formed to extend along the short-side direction from another end portion of the first rib 231*da* in the long-side direction, herein, an end portion opposite to the second rib 231*db* (see FIG. 12 etc.). The third rib 231*dc* is formed along the short-side direction to protrude from the bulged part 241 in the opposite side to the second rib 231*db* along the short-side direction. The third rib 231*dc* is formed to continue to the first rib 231*da* and includes the inclined surface 231*e*. The inclined surface 231*e* of the third rib 231*dc* is formed to be inclined such that the end portion of the first rib 231*da* side is positioned on the above in the vertical direction and the corner portion side of the inside of the casing 203 in the other side of the short-side direction, which is the destination of avoidance of water is positioned vertically below. The water-preventing rib 231*d* is provided with each inclined surface 231*e* as described above on an upper surface in the vertical direction. Each inclined surface 231*e* guides the water guided to the downside in the guiding space 239 from the avoidance target portion 240 along the avoidance direction, herein, to the position of the destination of avoidance deviated from the above in the vertical direction.

In the electrical connection box 201 configured as described above, for example, even if water invades in the casing 203 through the clearance of the connection portion between the frame 231 and the upper cover 233, by guiding the invaded water vertically below through the guiding space 239, it is possible to prevent the water from invading in the accommodating space 235 in which the electronic components 2 are accommodated. At this time, the electrical connection box 201 guides the water guided to the downside in the vertical direction within the guiding space 239 to a directed avoided from the avoidance target portion 240 by the water-preventing rib 231*d*. More specifically, the electrical connection box 201 moves the water guided vertically below within the guiding space 239 onto the first rib 231*da*, the second rib 231*db*, the third rib 231*dc*, and the inclined surfaces thereof which constitute the water-preventing rib 231*d* by dead weight. Thereby, the water is guided to the avoidance target portion 240, herein, the destination of avoidance deviated from the upper side of the bottom proximity part 240*a* in the vertical direction, in the bottom portion 232*b* of the lower cover 232. As a result, the electrical connection box 201 can prevent the water guided vertically below within the guiding space 239 from being attached to the bottom proximity part 240*a* close to the electronic components 2 in the bottom portion 232*b*, or splashing on the bottom proximity part 240*a*. Thus, in the electrical connection box 201, the water guided vertically below within the guiding space 239 and dropped on the bottom portion 232*b* of the lower cover 232 is properly treated by being discharged from, for example, a discharge opening (not shown) provided in the bottom portion 232*b* etc. to an exterior of the casing 203.

In the electrical connection box 201 and the wire harness WH2 described above, it is possible to prevent the water guided within the guiding space 239 from being attached to the avoidance target portion 240, and the avoidance target portion 240 from being exposed to the water. In addition, it is possible to treat the invaded water. Furthermore, in the electrical connection box 201 and the wire harness WH2, because the avoidance target portion 240 can be prevented from being exposed to the water, it is possible to suppress the water dropped within the guiding space 239 from splashing on the avoidance target portion 240, for example, it is possible to surely prevent the water from being splashed toward the accommodating space 235 in which the electronic components 2 are accommodated. As a result, in the electrical connection box 201 and the wire harness WH2, the water invaded in the casing 203 can be properly treated.

According to the electrical connection box 201 and the wire harness WH2 as described above, the casing 203 has the bottom portion 232*b* positioned on the downside of the guiding space 239 in the vertical direction. The avoidance target portion 240 includes the bottom proximity part 240*a* closer to the electronic components 2 than the destination of avoidance of water by the water-preventing rib 231*d* in the bottom portion 232*b*. The water-preventing rib 231*d* is positioned on the upper side of the bottom proximity part 240*a* in the vertical direction and has the inclined surface 231*e* extending to the destination of avoidance of water. Accordingly, even if the electrical connection box 201 and the wire harness WH2 have a configuration including the bottom proximity part 240*a* closer to the electronic components 2 than other parts in the bottom portion 232*b* of the casing 203, it is possible to move the water guided to the downside in the vertical direction within the guiding space 239 on the inclined surface 231*e* of the water-preventing rib 231*d* by the dead weight. As a result, because the electrical connection box 201 and the wire harness WH2 can guide the water to the position deviated from the upper side in the vertical direction of the bottom proximity part 240*a* which is the avoidance target portion 240, it is possible to properly treat the water invaded in the inside of the casing 203.

Note that the electrical connection box and the wire harness according to the present embodiment as described are not limited to the above-mentioned embodiments, various changes can be made to these embodiments within the scope described in Claims. The electrical connection box and the wire harness according to the present embodiments may configure by appropriately combining the components in each of the embodiments or modifications.

Although the casing 3 or 203 as described above has been formed as the three-layer divided structure in which the frame 31 or 231, the lower cover 32 or 232, and the upper cover 33 or 233 are divided, the casing is not limited to such a structure.

Although the avoidance target portion 40 or 240 as described above has been described to include the electric wire W which is inserted in the insertion opening and crosses vertically below the guiding space 39 as the object which is unfavorable when water is attached, it may include various electronic components such as a connector, a fuse, a relay, a junction, an electronic control portion, an electronic component portion formed by unitizing them, etc.

Although the electrical connection box 1 as described above has been described to hold the end portion of the corrugated tube T between the casing 3 and the corrugated cover 4 by the corrugated cover 4 being assembled to the casing 3, it is not limited thereto, and it may have a configuration in which the corrugated cover is not provided.

The electrical connection box and the wire harness according to the present embodiments guide and treat water that has entered in the casing vertically downward, by the guiding space that is partitioned horizontally next to the accommodating space that accommodates the electronic components, via the partition wall. In this configuration, in the electrical connection box and the wire harness, the water-preventing rib provided in the guiding space can guide the water that has been guided vertically downward in the guiding space in the direction to avoid the avoidance target portion that is positioned vertically below the guiding space. Consequently, the electrical connection box and the wire harness can prevent the water that has been guided in the guiding space from adhering to the avoidance target portion, and prevent the avoidance target portion from coming into contact with the water. With this configuration, the electrical connection box and the wire harness can treat the water that has entered in the casing. As a result, the electrical connection box and the wire harness can suitably treat the water entered in the casing.

Although the invention has been described with respect to specific embodiments for a complete and clear disclosure, the appended claims are not to be thus limited but are to be construed as embodying all modifications and alternative constructions that may occur to one skilled in the art that fairly fall within the basic teaching herein set forth.

What is claimed is:

1. An electrical connection box, comprising:
   a casing that includes an accommodating space that is formed therein and that accommodates an electronic component, and a guiding space that is partitioned horizontally lateral to the accommodating space therein via a partition wall, that extends in a vertical direction and guides water entered in the casing to a vertically downside, wherein
   the casing includes a water-preventing rib that is provided in the guiding space, and that guides water guided to the vertically downside in the guiding space, in a direction of avoiding from an avoidance target portion that is positioned vertically below the guiding space.

2. The electrical connection box according to claim 1, wherein
   the casing includes an insertion opening through which an electric wire connected to the electronic component is inserted,
   the avoidance target portion includes the electric wire that is inserted through the insertion opening and that crosses vertically below the guiding space, and
   the water-preventing rib includes an inclined surface that is positioned vertically above the avoidance target portion and that extends to a position deviated from vertically above the avoidance target portion.

3. The electrical connection box according to claim 1, wherein
   the casing has a bottom portion positioned vertically below the guiding space,
   the avoidance target portion includes a bottom proximity part close to the electronic component side with respect to a destination of avoidance of the water by the water-preventing rib in the bottom portion, and the water-preventing rib includes an inclined surface that is positioned vertically above the bottom proximity part and extends to the destination of avoidance.

4. The electrical connection box according to claim 2, wherein
   the casing has a bottom portion positioned vertically below the guiding space,
   the avoidance target portion includes a bottom proximity part close to the electronic component side with respect to a destination of avoidance of the water by the water-preventing rib in the bottom portion, and
   the water-preventing rib includes an inclined surface that is positioned vertically above the bottom proximity part and extends to the destination of avoidance.

5. A wire harness, comprising:
   an electric wire; and
   an electrical connection box that includes a casing that includes an accommodating space formed therein and that accommodates an electronic component connected to the electric wire, and a guiding space that is partitioned horizontally lateral to the accommodating space therein via a partition wall, that extends in a vertical direction and guides water entered therein to a vertically downward, wherein
   the casing includes a water-preventing rib that is provided in the guiding space, and that guides water guided vertically downside in the guiding space, in a direction of avoiding from an avoidance target portion that is positioned vertically below the guiding space.

* * * * *